United States Statutory Invention Registration [19]

[11] Reg. Number: H260

Morris et al. [43] Published: Apr. 7, 1987

[54] METALLIZATION FOR HERMETIC SEALING OF CERAMIC MODULES

[75] Inventors: Hayden Morris, Washington, D.C.; Henry W. Rhodes, Brentwood; Margaret C. Marlow, Monrovia, both of Md.

[73] Assignee: The United States of America as represented by the Secretary of the Navy, Washington, D.C.

[21] Appl. No.: 887,166

[22] Filed: Jul. 1, 1986

[51] Int. Cl.[4] ..... B27N 5/02; B32B 1/04

[52] U.S. Cl. ..... 428/35; 428/76; 174/52 PE; 29/588; 220/67; 220/359

[58] Field of Search ..... 428/76, 35; 220/67, 220/359; 174/52 PE; 29/588

*Primary Examiner*—John F. Terapane
*Assistant Examiner*—J. E. Thomas
*Attorney, Agent, or Firm*—Kenneth E. Walden; Frederick A. Wein

[57] ABSTRACT

A superior hermetic seal for ceramic modules is presented. The case base member is provided with metallization around the periphery of the cavity. The case cover is provided with metallization not only to mate with the metallization of the base, but the cover metallization extends onto the thickness edge. The dimensions of the cover are less than the corresponding metallization dimensions of the base member. In this manner the solder bead formed about the periphery will wet the exposed metallization surfaces and form a visually inspectable bead.

2 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METALLIZATION FOR HERMETIC SEALING OF CERAMIC MODULES

BACKGROUND OF THE INVENTION

The present invention relates to modules for hermetically sealing integrated circuits and more particularly to metallization of the parts of the module for superior sealing.

The present invention provides an improved method and device for improving the reproducibility and reliability of hermetically sealing modules for a microcircuit package by forming an improved solder joint. FIG. 1 which will be described in more detail hereinafter, shows the outside dimensional relationships of the metallized ceramic cover being designed to be the same as that of the sealing frame of the microcircuit package. Additionally, in the prior art, the metallized area on the ceramic cover was restricted to be only on that surface area mating with the base member.

As applied in particular to ceramic modules for microcircuits such as integrated or monolithic integrated circuits, a first thin layer of refractory metal such as tungsten or a mixture of molybdenum and manganese which forms a bond with the ceramic when subjected to the atmosphere and high temperatures in a dry hydrogen furnace is deposited. A second layer of metal such as nickel or copper is then deposited in order to improve solderability. A third top layer of gold plating is often deposited in a dry inert atmosphere in order to assure solderability without the use of flux.

In the prior art, the metallized ceramic cover is solder sealed to the frame of the microcircuit package by sandwiching a solder preform between the metallizations and then melting the preform. The heat to melt the solder is applied by running the assembly through the hot zone of a belt furnance or by applying a heated platen to the face of the ceramic cover. Disadvantages of this design are that the solder flow and wetting does not occur as planned, and the results cannot be positively determined by visual examination. Additionally, the solder melting methods are limited to those described hereinabove which can subject the microcircuit assembly to excessive amounts of heat.

Accordingly, it is desirable to provide a metallization for hermetic sealing of modules which overcomes the above-stated difficulties.

In view of the above, it is an object of the present invention to provide means for achieving formation of a superior hermetic seal for ceramic modules overcoming the above-stated difficulties.

Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention permits achievement of a superior hermetic seal for ceramic modules. The case base member is provided with a metallization around the periphery of the cavity. The case cover is provided with metallization not only to mate with the metallization of the base, but the metallization of the cover extends onto the thickness edge. Additionally, the dimensions of the cover and the metallization portion of the cover are less than the corresponding metallization dimensions of the base member so that portions of the metallization of the base and the lid are exposed. In this manner, the bead of the hermetically sealing material when applied to the metallization of the lid and the metallization of the base will form a bead of sealing material about the periphery with the bead extending along the metallization of the edge thickness of the cover and along the metallization of the base not covered by the cover thus forming a visually inspectable bead as well as a superior seal.

DESCRIPTION OF THE DRAWINGS

Referring now to the drawings wherein like reference numerals having been applied to like members.

DETAILED DESCRIPTION OF THE PREFERRED EMBODIMENT

Figure 1:
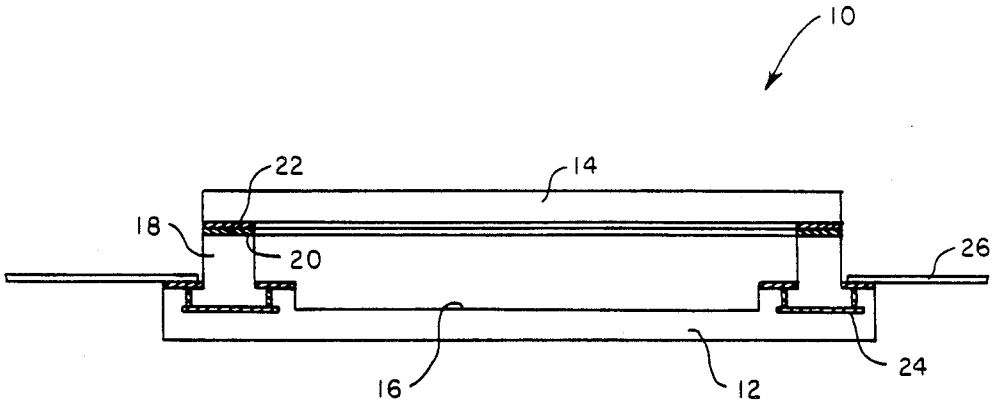
PRIOR ART FIG. 1
FIG. 1 is a plan view in partial cross-section showing a prior art module.

Referring now to the drawings wherein like reference numerals have been applied to like members, there is shown in FIG. 1 a prior art module, generally designated 10, having a base member 12 and a lid member 14 which enclose a cavity 16 in which can be enclosed an integrated circuit or the like (not shown). In the exemplary embodiment, base 12 and lid 14 are made of an appropriate ceramic material, e.g. oxides of alumina and silica. Base 12 is provided with a rim 18 with an upper outer surface upon which metallization 20, as discussed hereinabove, is deposited. Covering lid 14 is provided with metallization 22 in corresponding position with metallization 20. It is understood that the rim 18 totally surrounds the cavity 16 about the radial direction and that metallizations 20, 22 also go all the way around. Conductors 24 electrically connect the microcircuit to external lead 26 for connection to external circuitry (not shown).

As shown in FIG. 1 and as discussed hereinabove, the surfaces of the metallizations 20, 22 are planar and extend to the dimensional edge of the respective support surface, rim 18 and lid 14. Additionally, it should be noted that lid 14 extends to the dimensional limits of rim 18. In this way, when a solder preform is inserted between metallizations 20, 22 and heated as discussed above, cavity 16 is hermetically sealed. The joint thus developed has the problems discussed hereinabove and is not amenable to visual inspection.

Figure 2:
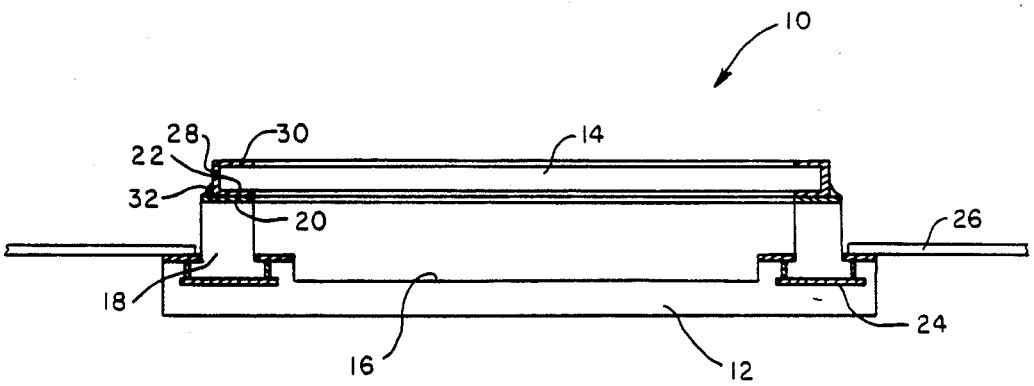
FIG. 2 is a plan view in partial cross-section showing, inter alia, in accord with the present invention, the dimensional relationship between the case base member and the lid member as well as metallization of the lid member.

Referring now to FIG. 2, there is shown the module according to the present invention. Lid 14 has an outside dimensions (length and width) less than the outside dimension of rim 18 by about 0.02 to 0.04 inches on each side all the way around. Additionally, metallization 22 is now additionally applied along the thickness outer edge 28 of lid 14. To solder seal the lid to the frame, the techniques discussed above can be used as well as parallel seam welding, conduction of electrical current through the metallization, hand soldering, laser heating, microwave heating, etc. since the metallization of the lid is now exposed and readily accessible. For such reasons, the metallization 22 as shown extends onto the top surface 30 of lid 14. When the solder melts, the surface tension and temperature of the melt will cause the solder to flow and form a fillet of solder all around the edge of the cover and the exposed edge of the rim, resulting in a superior sealing joint 32 which as shown extends to the outer edge of metallization 20 and upwardly along metallization 22 along the outer edge of lid 14 all the way around. Thus the solder will wet the metallization 22 along the vertical edge of ceramic lid 14 and the exposed surface of rim 18.

This solder bead 32 can be easily evaluated by visual inspection. The edge and corners of the cover 14 and rim 18 can be designed to provide a desired radius or geometry for the solder bead by surface tension. Additionally, this approach can be used with metal/glass as well as ceramic packages.

Thus, there is disclosed a package for microchips or the like having a superior hermetic seal. The cover has dimensions slightly less than the outer dimensions of the base and metallization of both the base and the cover are exposed with the cover positioned on the base so that an easily visually inspected bead of solder will be formed.

What is claimed is:

1. A module for hermetically sealing an interior cavity thereof comprising:

a casing comprising a base member and a lid member, the base member defining a cavity for receiving within the cavity a hermetically sealable member, the lid member being adapted for covering the open side of the cavity and enclosing the sealable member within the cavity, the base member having a first metallization portion circumscribed about the opening of the cavity the metallization being adapted for receiving a hermetically sealing material adhereable to the metallization, the metallized portion being adapted for receiving and abuttingly engaging the lid member thereon with the lid member having an engagably compatible surface for engaging the metallization portion, a portion of the compatible surface of the lid surface being circumscribingly second metallized for mating with the first metallized portion and adhering receiving the hermetically sealing material, the radial outer dimensions of the metallized surface of the lid being smaller than the corresponding radial outer dimensions of the first metallized portion so that portions of the first and second metallization are exposed, the lid member having a peripheral edge thickness, the metallization of the lid member extending over a portion of the edge thickness so that the hermetically sealing material when applied to the first and second metallizations will form a bead of sealing material. about the outside perimeter of the engagement of the base member and the lid member, said bead extending along the exposed portions of the first and second metallizations.

2. The module of claim 1 wherein the hermetically sealing material is solder and the base member and lid member are made of a ceramic material.

* * * * *